US 6,664,465 B2

(12) United States Patent
Seeber

(10) Patent No.: US 6,664,465 B2
(45) Date of Patent: Dec. 16, 2003

(54) TUNING SYSTEM FOR FLOATING RADIO FREQUENCY TRAP

(75) Inventor: Derek Seeber, Wauwatosa, WI (US)

(73) Assignee: IGC Medical Advances, Inc., Milwaukee, WI (US)

( * ) Notice: Subject to any disclaimer, the term of this patent is extended or adjusted under 35 U.S.C. 154(b) by 0 days.

(21) Appl. No.: 10/268,342

(22) Filed: Oct. 9, 2002

(65) Prior Publication Data

US 2003/0209354 A1 Nov. 13, 2003

Related U.S. Application Data

(63) Continuation-in-part of application No. 10/145,229, filed on May 13, 2002.

(51) Int. Cl.[7] .................................................. H05K 9/00
(52) U.S. Cl. ...................... 174/35 R; 174/35 C; 174/36
(58) Field of Search ........................... 174/35 R, 35 C, 174/36, 35 GC, 74 R, 77 R; 439/607, 608, 610

(56) References Cited

U.S. PATENT DOCUMENTS

| 5,631,443 A | * | 5/1997 | Scrimpshire et al. | ..... 174/35 R |
| 6,232,548 B1 | * | 5/2001 | Eberler et al. | ............ 174/35 R |
| 6,380,482 B1 | * | 4/2002 | Norte et al. | ............... 174/35 R |

FOREIGN PATENT DOCUMENTS

| JP | 03268397 A | * | 11/1991 | ............ H05K/9/00 |
| JP | 05137225 A | * | 6/1993 | ............ H02G/3/04 |

* cited by examiner

Primary Examiner—Dean A. Reichard
Assistant Examiner—Carmelo Oliva
(74) Attorney, Agent, or Firm—Quarles & Brady LLP

(57) ABSTRACT

A floating shield current trap provides two resonance loops formed of split concentric tubular conductors joined radially at their axial ends. Adjustment of the separation of these loops provides a change in coupling between the loops effecting a simplified tuning of the resonance of the trap for different expected frequencies of interfering shield current.

18 Claims, 4 Drawing Sheets

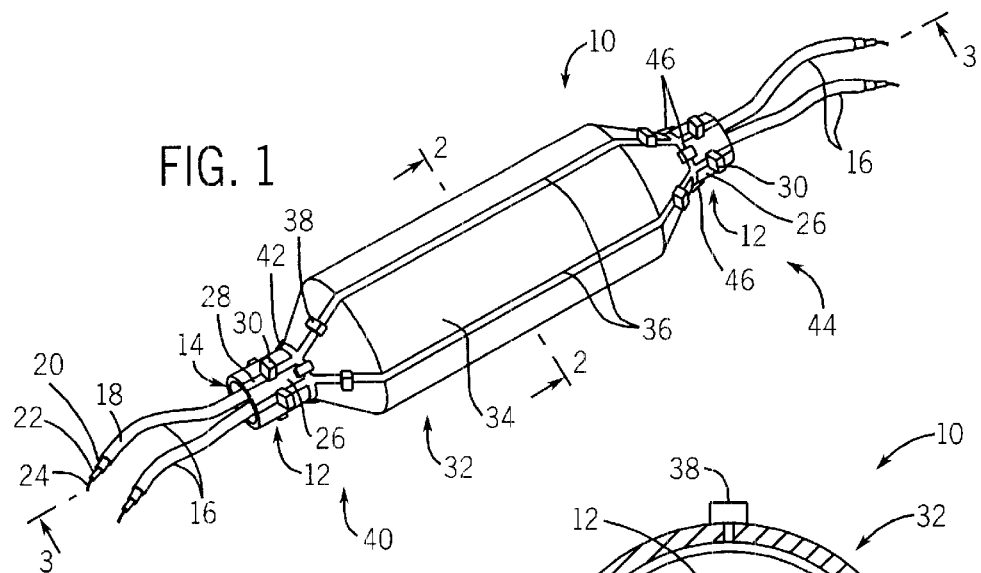
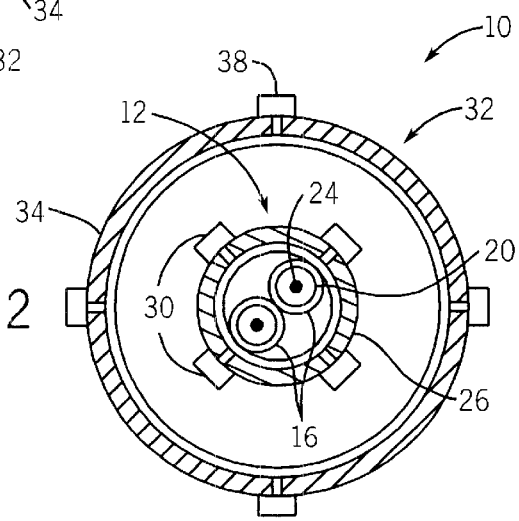
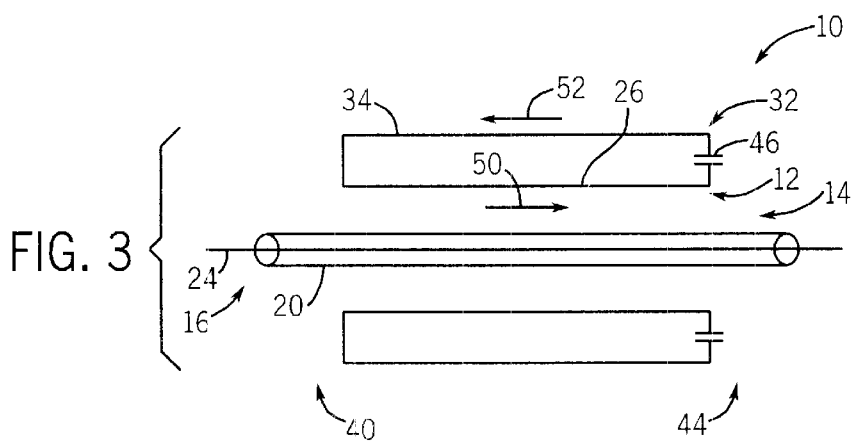

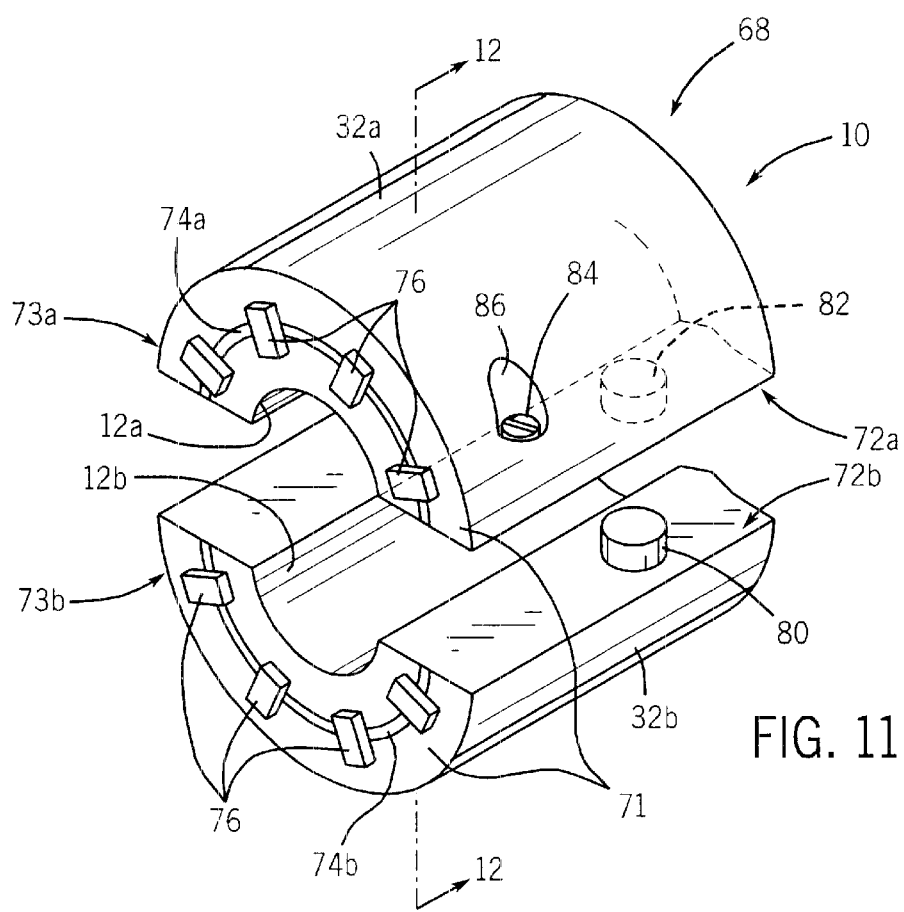
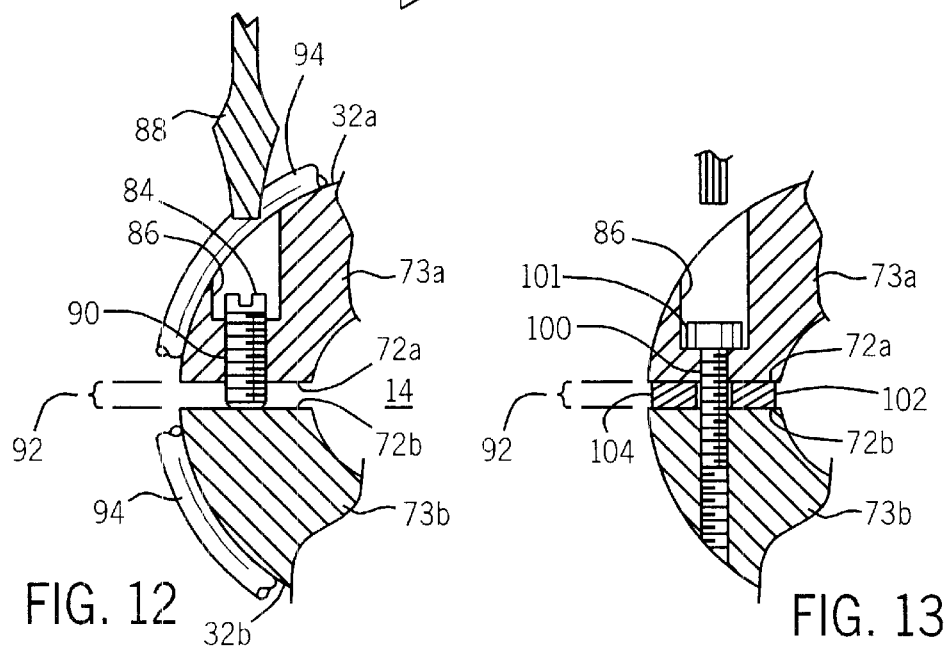

TUNING SYSTEM FOR FLOATING RADIO FREQUENCY TRAP

CROSS-REFERENCE TO RELATED APPLICATIONS

This application is a continuation-in-part of U.S. application Ser. No. 10/145,229, filed May 13, 2002 hereby incorporated by reference.

STATEMENT REGARDING FEDERALLY SPONSORED RESEARCH OR DEVELOPMENT

——

BACKGROUND OF THE INVENTION

The present invention relates to radio frequency traps and in particular to a floating trap suitable for use with magnetic resonance imaging equipment.

Electrical conductors used for transmitting signals susceptible to external electromagnetic noise often employ a center conductor surrounded by a conductive shield. The shield is grounded to prevent external electric fields from influencing the signal on the central conductor. A common "coaxial cable" shielded conductor, used for radio-frequency signals, employs a braided shield surrounding a central multi-strand conductor separated from the braided shield by an insulator of predetermined diameter and dielectric properties. The braded shield is surrounded in turn by a second insulator that protects the shield from damage or electrical contact with other conductors.

In applications where there are intense external electrical/magnetic fields, for example, in magnetic resonance imaging (MRI), significant current may be induced in the shield causing failure of the shielding effect and possibly damage to the shield and its adjacent insulation from heating. One method of reducing shield current is with ferrite "beads" which fit over the shield to resistively damp eddy currents induced by the shield currents and thus the shield currents themselves. It is also known to reduce such shield currents by creating an S-trap in which the coaxial cable is wound in a first direction and then optionally a second direction about a cylindrical form to produce a self-inductance among the coils of each winding set. A capacitance is connected in parallel with the inductance (by attaching leads of a capacitor to the shield at separated points in each winding) providing parallel resonant circuits tuned to the particular frequency of the offending external radio frequency field. The resonance provides the shield with a high impedance at the frequency of the interference, resisting current flow at this frequency, while the counter-winding reduces inductive coupling of the trap to the noise.

While the S-trap may successfully reduce current flow in the shield, it requires additional cable length for the windings and thus may contribute to a loss of signal strength and may introduce an undesirable phase change in the signal. Further, manufacture of the S-trap is cumbersome, requiring modification of the coaxial cable, including a removal of portions of its external insulation for attachment of a capacitor. The fixed position of the S-trap makes it difficult to adjust the S-trap to a location on the shield having maximum current, as is desirable. Ferrite beads are unsuitable in areas of intense magnetic fields, such as are found in magnetic resonance imaging machines.

Co-pending U.S. application Ser. No. 10/145,229 filed May 13, 2002 describes a shield current trap having a first and second, concentric, tubular conductor electrically connected to provide a resonance-induced high impedance to current flow in a surrounded shielded cable. The shield current trap so described does not require a direct electrical connection to the shielded cable and so may float on the cable to be easily added, removed, or adjusted in position.

The effectiveness of this floating shield current trap requires that it be closely tuned to the expected frequency of the shield current. When such a trap is used with MRI equipment, the predominant shield currents will be equal to the Larmor frequency of precessing hydrogen protons within the magnetic field of the MRI machine.

The Larmor frequency depends on the strength of the magnet and varies among manufacturers for a given magnet size (e.g. 1.5 Tesla) and for different magnet sizes among a single manufacturer. Ideally, one such shield current trap could be used for all systems despite this variation in frequency.

BRIEF SUMMARY OF THE INVENTION

The present invention provides an improved floating shield current trap that provides a simple tuning mechanism so that the trap may be used with different machines. Generally, the floating trap is divided along its axis into separate resonant loops. By adjusting the separation between these loops, the coupling between the loops is changed, adjusting the trap's resonant frequency.

Specifically, the present invention provides a shield current trap having a first trap element with a first inner conductive channel joined at a respective first and second axial ends, via a first and second radial conductor, to corresponding first and second ends of a first outer conductive shell to form a first resonant loop. A second trap element having a second conductive channel joined at respective first and second axial ends, via third and fourth radial conductors, to first and second ends of a second outer conductive shell forms a second resonant loop. The first and second conductive channels may be assembled in opposition to enclose an axially extending shielded cable. A clamp assembly controls the separation of the first and second trap elements to control the coupling between the first and second resonant loops.

Thus, it is one object of the invention to provide a simple method of adjusting the frequency at which the trap is resonant and thereby accommodating both for manufacturing tolerances and variations between shield current frequencies in different applications.

At least one of the inner conductive channels, the outer conductive shell, and the first through fourth radial conductors include a series capacitor.

Thus, it is another object of the invention to allow capacitive tuning of the loops such as may provide more compact trap size.

The clamping means may be a spring clip fitting around the first and second trap elements to draw them together.

Another object of the invention is to provide a simple mechanical means for holding the trap elements together while allowing adjustment.

The clamping means may include adjustable standoffs extending from the first trap element to space the second trap element therefrom. In one embodiment, the standoffs may be set screws partially extending from threaded holes in the first trap element to extend outward therefrom to abut a portion of the second trap element.

Thus, it is another object of the invention to provide for easy adjustability of the shield trap without the need for a variety of shims or the like.

The clamping means may alternatively be a machine screw having a head engaging the first trap element and threads engaging a threaded hole in the second trap element to draw the first and second trap elements together with a tightening of the machine screw. The separation between the first and second trap elements may include a spring urging the first and second trap elements apart. That spring may be an elastomeric polymer.

Thus, it is another object of the invention to provide a simplified alternative adjustment mechanism.

The invention may include alignment guides holding the first and second trap elements in alignment for a range of separation of the first and second trap elements, for example, dowels and interfitting bores.

Thus, it is another object of the invention to hold the shells in alignment during the adjustment process simplifying the adjustment process and further preventing shifting after the adjustment is complete.

Another object of the invention is to provide an adjustment mechanism that allows separation of the trap for insertion of the shielded cable into the trap after the cable is connected to equipment or connectors such as would prevent the cable from being threaded through the bore of the trap.

These particular objects and advantages may apply to only some embodiments falling within the claims and thus do not define the scope of the invention.

BRIEF DESCRIPTION OF THE DRAWINGS

FIG. 1 is a perspective view of a shield current trap of the present invention as fit over two coaxial cables, showing the invention's concentric outer and inner conductive structures;

FIG. 2 is a cross-sectional view of the shield current trap of FIG. 1 taken along lines 2—2 showing the successive layers of conductors of the outer conductive structure, the inner conductive structure and the shield of the coaxial cables;

FIG. 3 is a schematic representation of the shield current trap of FIG. 1 taken in cross section along lines 3—3 of FIG. 1 as positioned around a single coaxial cable showing the suppression of shield currents through tuning of the inner and outer conductive structures;

FIG. 11 is a figure similar to that of FIG. 10 showing an alternative embodiment of the shield current trap that provides simplified tuning;

FIG. 12 is a cross-sectional fragmentary view taken along line 12—12 of FIG. 11 showing the use of set screws and a spring clamp to adjust the separation of two halves of the shield current trap of FIG. 11; and FIG. 13 is a figure similar to that of FIG. 12 showing an alternative embodiment of the adjustment mechanism in which a machine screw pulls the two halves of the shield current trap together against the resisting force of a trapped elastomer.

DETAILED DESCRIPTION OF THE PREFERRED EMBODIMENT

General Shield Current Trap

Figure 4:
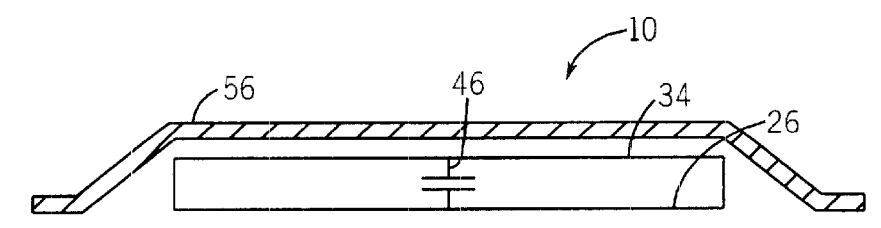
FIG. 4 is a fragmentary, schematic, cross-section similar to FIG. 3 showing an alternative embodiment in which high voltages on the outer conductive structure are displaced toward the center of the current trap to be covered by an insulating outer housing.

Referring now to FIGS. 1 and 2, a shield current trap 10 of the present invention may include a tubular inner portion 12 having a central lumen 14 receiving one or more coaxial cables 16 of conventional design. The size of the central lumen 14 may be varied depending on how many cables are to be accepted. Each coaxial cable, known in the prior art, includes an outer insulating sheath 18 fitting around a braided, rigid, or similar shield 20 covering an insulator 22 having a central signal-carrying conductor 24.

The tubular inner portion 12 of the shield current trap 10 may be insulating and have a conductive surface, typically of copper foil, to produce an inner conductor 26 extending along its entire surface, broken only by optional longitudinal slots 28 intended to prevent circumferential eddy currents at low frequencies produced, for example, by gradient magnetic fields used in the MRI machine. The foil may be aligned by shallow longitudinal grooves cut in the outer surface of the tubular inner portion 12. The slots 28 are optional and are unnecessary if the problem of eddy currents is not significant in the particular application. The tubular inner portion 12 may have an arbitrary cross section not limited to circular but including rectangular and other shapes. Bridging capacitors 30 are attached across the slots 28 to provide a conductive path for radio frequencies and thereby a substantially unbroken conductor at the frequency of the expected interference. For a typical MRI machine with a 1.5 Tesla magnet, the expected radio-frequency interference will be at approximately 64 megahertz, but the invention is not limited to a particular frequency range and may find use in frequencies ranging from 40 to 500 megahertz.

Fitting around the tubular inner portion 12 of the shield current trap 10 is a large diameter tubular outer portion 32 whose outer surface is conductive to provide an outer conductor 34. Again, the tubular outer portion need not have a circular cross section. The outer conductor 34 is broken by longitudinal slots 36 (like the inner conductor 26 of the tubular inner portion 12) preventing low-frequency eddy currents and bridged by optional radio frequency conducting capacitors 38 to provide a substantially unbroken radio frequency conductor. Again, the outer conductor 34 may be applied as foil aligned by means of shallow longitudinal grooves cut in the outer surface of the tubular outer portion 23. The slots 36 are particularly useful when low-frequency magnetic fields will be present as is the case with magnetic resonance imaging.

In one embodiment, the tubular outer portion 32 tapers inward while maintaining its cylindrical aspect at either end of the tubular outer portion 32 to approach the tubular inner portion 12. At a first end 40 of the shield current trap 10, the outer conductor 34 of the tubular outer portion 32 is electrically connected to the inner conductor 26 of the tubular inner portion 12 by capacitors 42. These capacitors 42 are selected to be large enough to provide essentially no impedance at the expected radio frequency of the interference.

At a second, opposing end 44 of the shield current trap 10, the outer conductor 34 of the tubular outer portion 32 is also attached to the inner conductor 26, but through capacitors 46, selected to tune the shield current trap 10 to resonance at the frequency of the expected external interference. The resonance is "parallel resonance" creating a high impedance to longitudinal current flow traveling in a path in a first direction in the outer conductor 34 of the tubular outer portion 32 and in the opposite direction in inner conductor 26 of the tubular inner portion 12. Capacitors 46 are selected to adjust the path length in this path to be substantially equal to an odd multiple of one-quarter of the wavelength of the expected external interfering signal. This condition creates a high impedance resisting current flow at the frequency of the expected interfering signal. In the event that the expected interfering signal is comprised of many frequencies, as will often be the case, the adjustment of the electrical length of the path may be made with respect to a dominant frequency component or multiple shield current traps 10 may be used. The suppression of shield current flow is accomplished by proper selection of the dimensions of the inner conductor 26 and the outer conductor 34, or those dimensions and the value of capacitor 46 so that a high impedance is created in those conductors at the resonant frequency of the external interfering field, preventing current 52.

Significantly, this high impedance and suppression of current 52 requires no direct electrical connection between elements of the shield current trap 10 and the coaxial cable 16 such as would require cutting the outer shield away from the coaxial cable 16.

Referring now to FIG. 4, the path formed by outer conductor 34 and inner conductor 26 may be broken into multiple (in this example: two) sub-paths by joining outer conductor 34 and inner conductor 26 through low impedance connections at the two opposite ends of the shield current trap 10 and joining outer conductor 34 and inner conductor 26 at midpoints with capacitor 46. Again, the value of the capacitor 46 is selected so that each sub-path has an electrical length being an odd multiple of one quarter of the wavelength of the expected interfering external signal. In this case, high voltages on the outer conductor 34 are displaced toward the center of the shield current trap 10. An insulating covering 56 is placed around the outer conductor 34 to protect the user from these voltages. Clearly, an arbitrary number of sub-paths may be created in this manner. The insulating covering 56 may conform generally to the outer conductor 34 and the inner conductor 26, the extent of the inner conductor 26 is exposed at either end of the shield current trap 10, so as to fully insulate all exposed conductive surfaces of the shield current trap 10.

Figure 5:
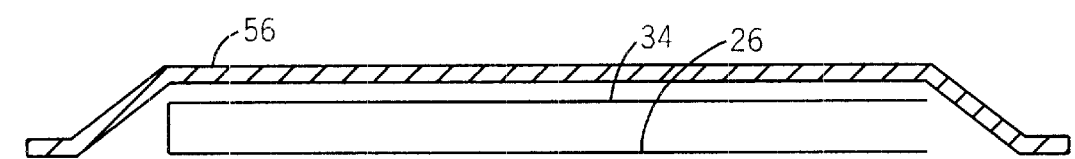
FIG. 5 is a figure similar to that of FIG. 4 showing yet an alternative embodiment eliminating the tuning capacitor.

Referring to FIG. 5, it will be understood that the path formed by outer conductor 34 and inner conductor 26 may be sized to be of the desired electrical length (an odd multiple of one quarter of the wavelength of the interfering signal) without the need for the capacitor 46 simply by adjusting the actual length of the inner and outer conductors 26 and 34. This generally will increase the length of the shield current trap 10 but may be appropriate for certain applications.

It will be understood to those of ordinary skill in the art that the paths of FIGS. 3–5 may be repeated an arbitrary number of times and that further, each separate path may be tuned independently to address a different frequency of interference.

The ability of the shield current trap 10 to operate without direct electrical connection to the contained coaxial cable 16 allows the shield current trap 10 to be installed or removed freely at any time by simply threading the coaxial cable 16 through the lumen 14 of the tubular inner portion 12. In certain situations, however, threading the coaxial cable 16 through the tubular inner portion 12 will be obstructed by electrical connectors or the like attached to the coaxial cable 16. Accordingly, the present invention contemplates that the shield current trap 10 may be constructed in two halves split longitudinally along an axis of symmetry.

Figure 6:
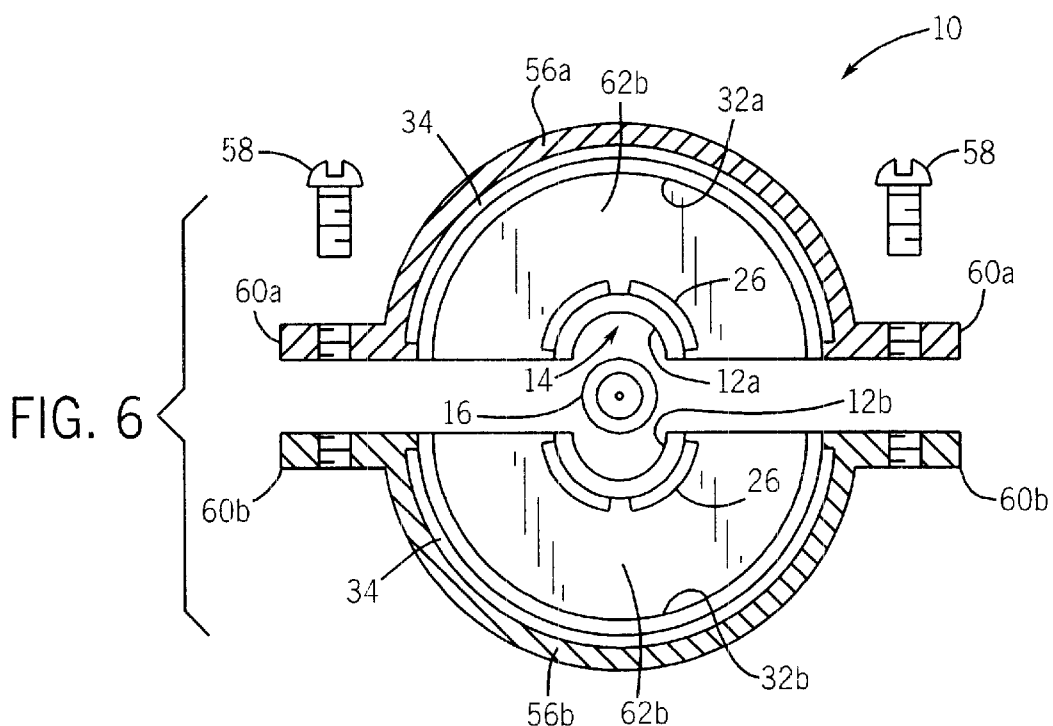
FIG. 6 is a cross sectional view similar to FIG. 2 showing an embodiment in which the shield current trap is assembled from two halves so that it may be placed about a shielded cable without a threading of the cable through the shield current trap.

Referring now to FIG. 6, the tubular inner portion 12 may be split into two hemi-cylindrical portions 12a and 12b. Likewise, the tubular outer portion 32 (including the tapered ends) may be split into two corresponding hemi-cylindrical portions 32a and 32b and, the insulating cover may be split into two hemi-cylindrical covers 56a and 56b. Each of hemi-cylindrical covers 56a and 56b may include transversely extending the tabs 60a and 60b, respectively, abutting along a separation plane when the two halves of the shield current trap 10 are assembled together. Clearly, this principle can be extended to a splitting of the tubular inner and outer portions 12 and 32 into more than two pieces, as well.

Machine screws 58 fabricated from nylon or other non-ferromagnetic materials, or the like (for example, interfitting snaps molded as integral parts of the housing) may be used to attach the tabs 60a and 60b together about the coaxial cable 16 without the need to thread the cable 16 through the lumen 14. Alternatively, but not shown, the machine screws 58 may be received within bores in the cylindrical body of the shield current trap 10 eliminating the need for the tabs 60a and 60b.

Dielectric spacers 62a and 62b may be used to support the inner tubular portions 12a and 12b with respect to the outer tubular portions 32a and 32b, the latter of which are held by the insulating housings 56a and 56b. Alternatively, dielectric spacers 62a and 62b are eliminated by direct mechanical connection in the tapered portion of the housing 56a and 56b to the inner tubular portions 12a and 12b as may be better understood by also viewing FIGS. 4 and 5.

Figure 7:
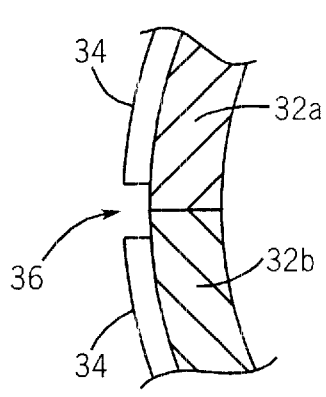
FIG. 7 is a fragmentary cross-sectional view of an interface between conductive structures of the embodiment of FIG. 6 in which the separation of the halves is along longitudinal eddy current reducing slots.
Figure 8:
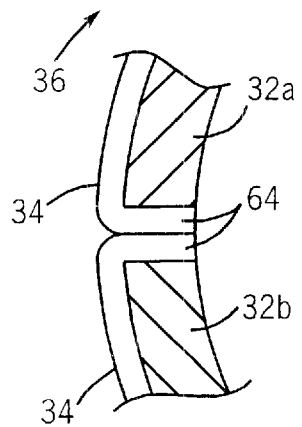
FIG. 8 is a figure similar to FIG. 7 in which the conductive structures of FIG. 6 are connected by electrically conductive fingers forming a releasable electrical connector.

Referring now to FIG. 7, the shield current trap 10 may be separated along a longitudinal slot 36 in the outer conductor 34 (and aligned slots 28 in the inner conductor 26) to prevent the need for electrical interconnection of the halves. Alternatively, as shown in FIG. 8, outer conductor 34 (and corresponding inner conductor 26) may include conductive fingers 64 pressed together at the interface between the halves of the shield current trap 10 when they are assembled providing electrical interconnection. In this latter case, eddy current reducing slots 36 may be displaced away from the parting line of the shield current trap 10. The embodiment of FIG. 8 allows use of bridging capacitors 30 across the gaps provided to reduce any currents.

In an alternative embodiment, not shown, the halves of the shield current trap 10 may be hinged to open at only one edge.

Figure 9:
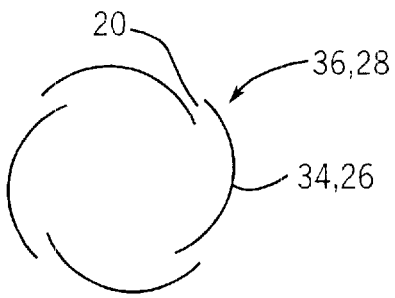
FIG. 9 is a simplified cross section along lines 2—2 showing an alternative method of creating eddy current suppressing slots in the conductors of the inner and outer conductive structures.

Referring now to FIG. 9, in an alternative embodiment, the slots 36 or 28 may be formed not by circumferential gaps in the outer conductor 34 and inner conductor 26, respectively, but by radial gaps 70 formed by overlap of the outer conductors 34 and inner conductors 26. Overlap in the outer conductors 34 or inner conductors 26 may provide for the optional radio frequency conducting capacitors 38 as well, or discrete capacitors may be placed across these gaps.

Figure 10:
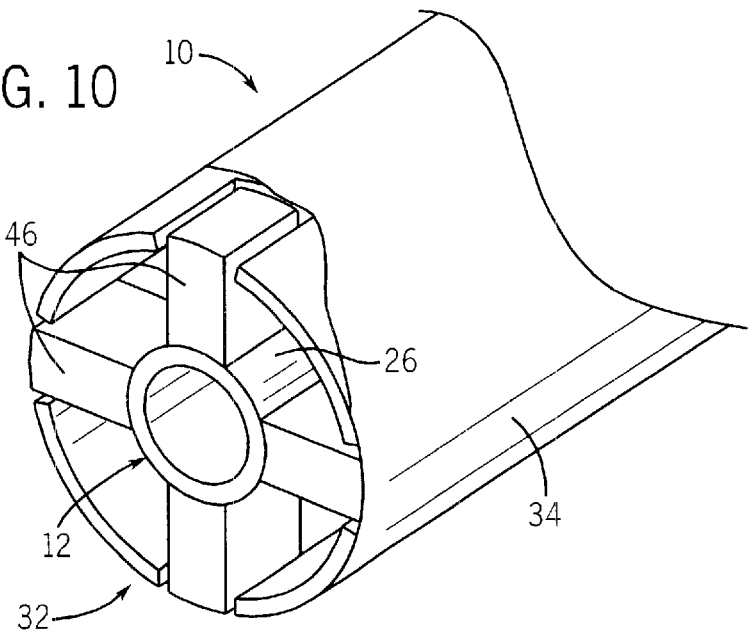
FIG. 10 is a fragmentary perspective view of an alternative embodiment of the inner and outer conductive structures showing a simplified construction technique and elimination of eddy current suppressing slots.

Referring to FIG. 10, the slots 28 and 36 may be eliminated altogether when eddy currents are not a problem. The tapering of the outer conductor 34 may be avoided by using the tuning capacitors 46 to connect the inner and outer conductors 26 and 34.

In use, the shield current trap 10 may be slid along the cable 16 so as to be located near a point of maximum shield current and thereby to have greatest effect. Such adjustment is not possible with prior art S-traps.

Shield Current Trap with Adjustable Tuning

Referring now to FIG. 11, a shield current trap 10 providing adjustable tuning may be constructed using a split, solid wall, cylindrical tube 68. The tube 68 is split along its axial-diametric plane to produce mirror image, arcuate, tube half 73a and tube half 73b. The tube 68 provides opposed ends 71 being generally bases of the cylinder lying in a radial plane.

The tubular inner portions 12a and 12b referred to above are provided by an inner arch wall of each tube half 73a and 73b. The tubular outer portions 32a and 32b referred to above are provided by an outer arch wall of each tube half 73a and 73b. The tube 68 may be reconstituted by joining opposed walls 72a and 72b of each tube half 73a and 73b, respectively.

All surfaces of the tube halves 73a and 73b are metallized except for the opposed walls 72b and 72a, and arcuate slots 74b and 74a formed in tube half 73a and 73b, respectively, at one end 71 of the tube 68. The remaining end 71 (not shown) is fully metallized.

This metallization may be easily accomplished by plating the tube 68, milling a slot at a constant radius at one end 71 to remove the plating along the arcuate slots 74a and 74b, then slicing the tube 68 to separate the opposed walls 72a and 72b.

The slots 74a and 74b may be bridged by capacitors 76 serving the same function as capacitors 46 described above. Thus, two electrical loops are formed by the cutting of tube 68 into tube halves 73a and 73b. The first loop is along an axial path following the outer tubular portion 32a, as metallized, passing radially along a first end 71 (not shown in FIG. 11) to the inner tubular portion 12a and axially along the inner tubular portion, and then radially along the second end 71 to cross the slot 74a through bridging capacitor 76. A second loop is formed following the similar path but with the outer tubular portion 32b to the first end 71, back along inner tubular portion 12a to second end 71 and, across slot 74 through capacitors 76 back to the outer tubular portion 32b.

Referring still to FIG. 11, generally the tube halves 73a and 73b may be fit together in alignment with wall 72a parallel to and proximate to wall 72b as guided by several dowel pins 80. The dowel pins 80 extend upward perpendicularly from wall 72b to be received by corresponding bore 82 in wall 72a. Multiple dowel pins 80 and bores 82 assure that the tube halves 73a and 73b are generally in alignment with walls 72a and 72b parallel to each other for a range of separations through which the dowel pins 80 retain engagement with bores 82.

Referring now to FIG. 12, the precise separation between tube halves 73a and 73b may be controlled by a set screw 84 accessible through a bore 86 cut through the outer portion 32a of tube half 73a so that a screwdriver 88 may be inserted through the bore 86 to engage the head of the set screw 84. The set screw 84 passes through a threaded hole 90 through the tube half 73a to extend from wall 72a by a standoff distance 92. The tip of the set screw thus may abut wall 72b defining a standoff distance 92 between walls 72a and 72b. At least three set screws will be used contacting different points of wall 72b to establish a planar relationship between walls 72a and 72b.

A split ring, spring clamp 94 may be applied to the outer circumference of the assembly of tube half 73a and 73b to hold tube half 73a and 73b together at the standoff distance 92. The spring clamp 94 may be a polycarbonate C-clip or the like engaging surfaces 32a and 32b.

As will be understood, the tube halves 73a and 73b may be fit together about an existing cable (not shown) to form a lumen 14 through which the cable may run and the spring clamp 94 opened and placed about them to hold them together on the set screws 84.

Tuning the shield current trap 10 is accomplished by coupling the trap to a conventional resonance testing apparatus, for example, a loop formed from the shield and central conductor of a shielded cable driven at a desired resonant frequency and coupled to a voltmeter. With the shield current trap 10 so connected, a screwdriver blade 88 is inserted into the set screws 84 to adjust the standoff distance 92 until the desired resonance is achieved. Generally, the capacitor 76 will be adjusted so that the tuning of the individual loops of the tube halves 73a and 73b is approximately correct (within manufacturing tolerances) for a given separation of the tube halves 73a and 73b and, the set screws 84 are adjusted to increase or decrease the separation distance as required to achieve the desired Larmor frequency for the particular equipment.

Preferably, the assembly shown in FIG. 2 may be placed with a separate protective housing (not shown) and in this case, the spring clamp 94 may apply force to the housing.

Referring now to FIG. 13, in an alternative embodiment, the bore 86 may receive a machine screw 100 whose head 101 rests against a bottom of the bore 86 and whose threaded portion extends out of wall 72a to be received in a corresponding threaded hole 102 cut into wall 72b. Walls 72a and 72b may be separated by elastomeric washer 104 which holds the walls 72a and 72b in separation by its relaxed thickness. Tightening of the screw 100 serves to pull tube halves 73a and 73b together squeezing the washer 104 as necessary.

It is specifically intended that the present invention not be limited to the embodiments and illustrations contained herein, but that modified forms of those embodiments including portions of the embodiments and combinations of elements of different embodiments also be included as come within the scope of the following claims. For example, the trap need not be split into halves but may have a single slot making it a "C" or may be split into thirds or the like.

I claim:

1. A shield current trap for use with a shielded cable having an outer shield surrounding at least one inner conductor, the shield current trap comprising:
    a) a first trap element having a first inner conductive channel joined at respective first and second axial ends by a first and second radial conductor to first and second ends of a first outer conductive shell to form a first resonant loop;
    b) a second trap element having second inner conductive channel joined at respective first and second axial ends by a third and fourth radial conductor to first and second axial ends of a second outer conductive shell to form a second resonant loop; whereby the first and second inner conductive channels may be assembled in opposition to enclose the axially extending shielded cable; and c) a clamp assembly for controlling the separation of the first and second trap elements whereby coupling between the first and second resonant loops may be controlled to adjust a frequency at which the first and second conductive loops are resonant.

2. The shield current trap of claim 1 wherein at least one of the inner conductive channels, the outer conductive channels and the first through fourth radial conductors include a series capacitor.

3. The shield current trap of claim 1 wherein the clamping means includes a spring clip fitting around the first and second trap elements to draw them together.

4. The shield current trap of claim 1 wherein the clamping means includes adjustable standoffs extending from the first trap element to space the second trap element therefrom.

5. The shield current tap of claim 4 wherein the adjustable standoffs are set screws held partially in threaded holes in the first trap element to extend outward therefrom to abut a portion of the second trap element.

6. The shield current tap of claim 1 wherein the clamping means is at least one machine screw having a head engaging the first trap element and threads engaging a threaded hole in the second trap element so as to draw the first and second trap elements together with tightening of the machine screw.

7. The shield current tap of claim 1 wherein further including a spring urging the first and second trap elements apart.

8. The shield current tap of claim 7 wherein the spring is an elastomeric polymer positioned between the first and second trap elements.

9. The shield current tap of claim 1 further including alignment guides holding the first and second trap element in alignment for a range of separations of the first and second trap elements.

10. The shield current tap of claim 9 wherein the alignment guides are interfitting dowels and bores.

11. A shield current trap for use with a shielded cable having an outer shield surrounding at least one inner conductor, the shield current trap comprising: an axially divided cylindrical tube having metallized outer walls, inner walls, and bases, the axially divided cylindrical tube further having non-metallized opposed planer walls at the split, the opposed planar walls supporting an adjustment mechanism for controllably separating the opposed planar walls.

12. The shield current tap of claim 1 wherein the axially divided cylindrical tube is a solid insulator.

13. The shield current tap of claim 11 wherein the clamping means includes a spring clip fitting around the divided cylindrical tube to draw the opposed planar walls toward abutment and adjustable screws extending from one opposed planar wall to the other holding the opposed planar walls in separation.

14. The shield current tap of claim 11 wherein the clamping means is a machine screw having a head engaging a first opposed planar wall and threads engaging a second planar wall so as to draw the opposed planar walls toward abutment and with tightening of the machine screw and a spring fitting between the first and second opposed walls urging them into separation.

15. The shield current tap of claim 11 further including alignment guides holding the first and second opposed walls in alignment for a range of separations of the first and second opposed walls.

16. The shield current trap of claim 15 wherein the alignment guides are interfitting dowels and bores.

17. A shield current trap for use with a shielded cable having an outer shield surrounding at least one inner conductor, the shield current trap comprising:

(a) a first split tubular conductor extending longitudinally between a first and second end;

(b) a second split tubular conductor extending longitudinally between the first and second end and surrounding the first split tubular conductor, wherein the first and second tubular conductors are electrically connected at the first and second ends to provide at least one current path having an electrical length that is an odd multiple of one quarter of a wavelength of an external electrical interference signal; wherein the first and second split tubular conductors are openable to receive a portion of the shield of the shielded cable and adjustably closable to surround the portion of the shield of the shielded cable while remaining insulated from the shield of the shielded cable at one of a range of separation distances whereby coupling, between portions of the split tubular conductors, may be controlled to adjust a frequency at which the electrical length that is an odd multiple of one quarter of a wavelength of the external electrical interference signal.

18. The shield current tap of claim 17 wherein the external electrical interference signal is substantially in a range of 40 to 500 megahertz.

* * * * *